United States Patent [19]

Bakermans et al.

[11] Patent Number: 4,504,887
[45] Date of Patent: Mar. 12, 1985

[54] LEADLESS INTEGRATED CIRCUIT PACKAGE HOUSING HAVING MEANS FOR CONTACT REPLACEMENT

[75] Inventors: Johannes C. W. Bakermans; Iosif Korsunsky, both of Harrisburg, Pa.

[73] Assignee: AMP Incorporated, Harrisburg, Pa.

[21] Appl. No.: 481,115

[22] Filed: Apr. 1, 1983

[51] Int. Cl.³ .............................................. H05K 1/18
[52] U.S. Cl. .............................. 361/399; 174/52 FP; 339/17 CF; 361/403
[58] Field of Search ..................... 174/68.5, 52 FP; 361/403, 399; 339/17 CF

[56] References Cited

U.S. PATENT DOCUMENTS

| | | | |
|---|---|---|---|
| 3,805,212 | 4/1974 | Landman et al. | 361/403 X |
| 3,846,734 | 11/1974 | Pauza et al. | 174/52 FP X |
| 3,940,786 | 2/1976 | Scheingold et al. | 339/17 CF X |
| 3,982,159 | 9/1976 | Dennis et al. | 339/17 CF X |
| 4,268,102 | 5/1981 | Grabbe | 339/17 CF X |
| 4,330,683 | 5/1982 | Parker | 174/52 FP |
| 4,354,720 | 10/1982 | Bakermans | 339/17 CF X |
| 4,395,084 | 7/1983 | Conrad | 339/17 CF X |
| 4,410,223 | 10/1983 | Baker | 339/17 CF |
| 4,445,736 | 5/1984 | Hopkins | 174/52 FP X |
| 4,449,770 | 5/1984 | Grabbe et al. | 339/17 CF |

FOREIGN PATENT DOCUMENTS 2091036 7/1982 United Kingdom ........... 174/52 FP

Primary Examiner—R. R. Kucia
Attorney, Agent, or Firm—Donald M. Boles

[57] ABSTRACT

A high speed socket housing having a relatively simple manner of contact inspection and/or replacement is taught. Briefly stated, the device includes a chip carrier housing having a portion which is removable therefrom and which thereby exposes the contacts contained in slots or partitions in the housing. Thereby, upon removal of a portion of the housing an inspection, replacement, and/or testing of individual contacts may be accomplished without disturbing the remainder of the contacts or removal of the entire chip carrier housing from a printed circuit board.

10 Claims, 7 Drawing Figures

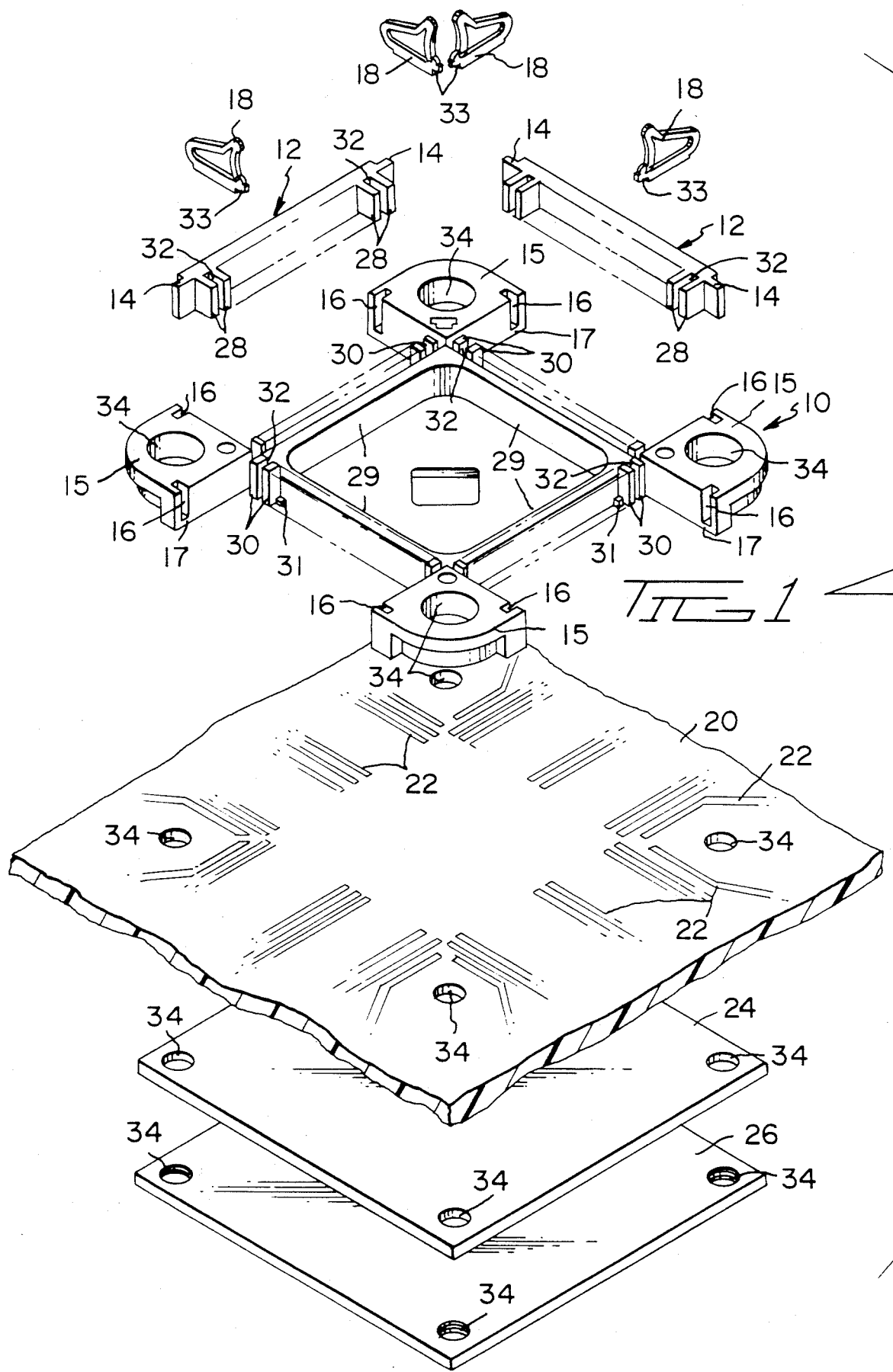

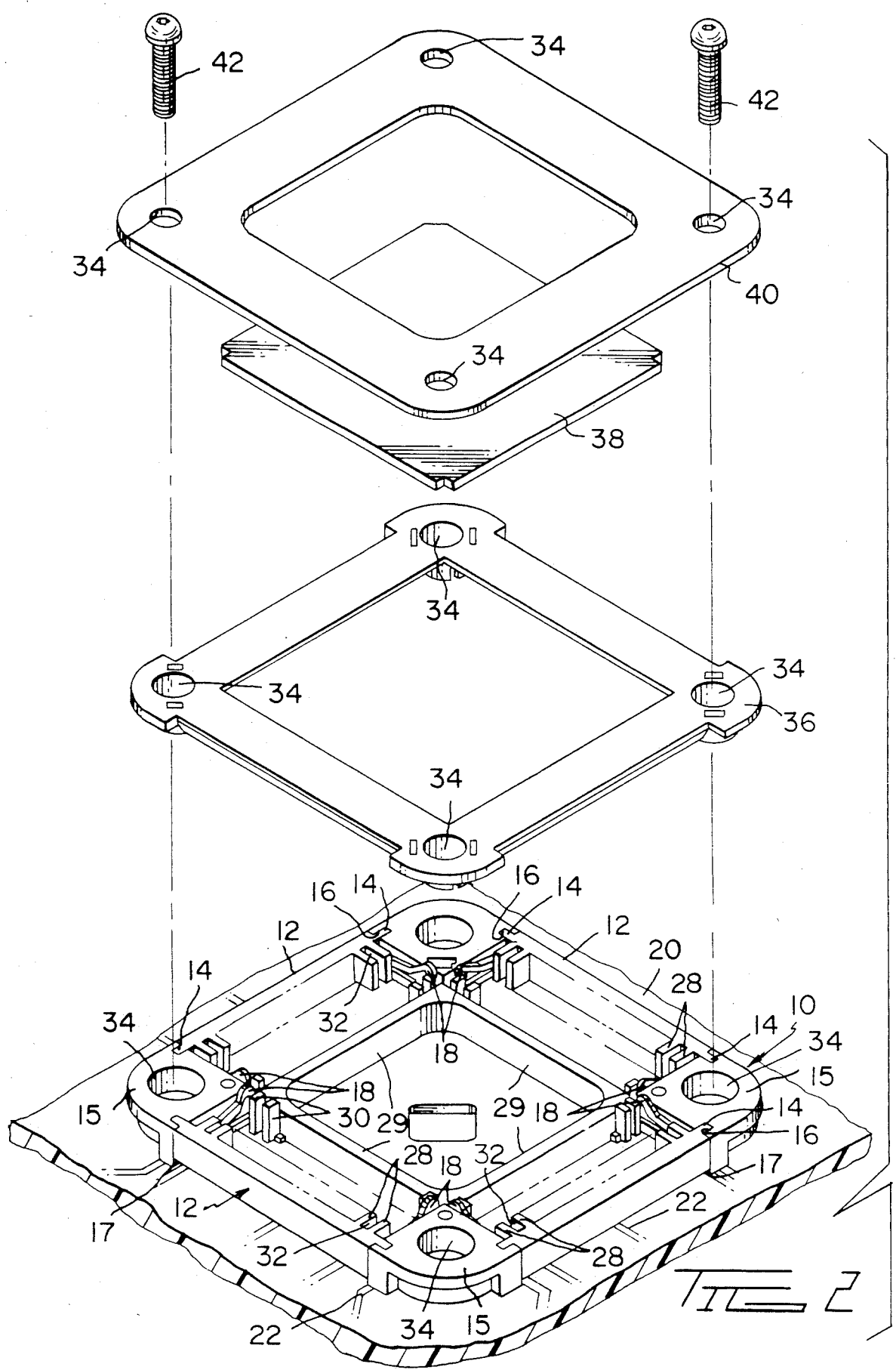

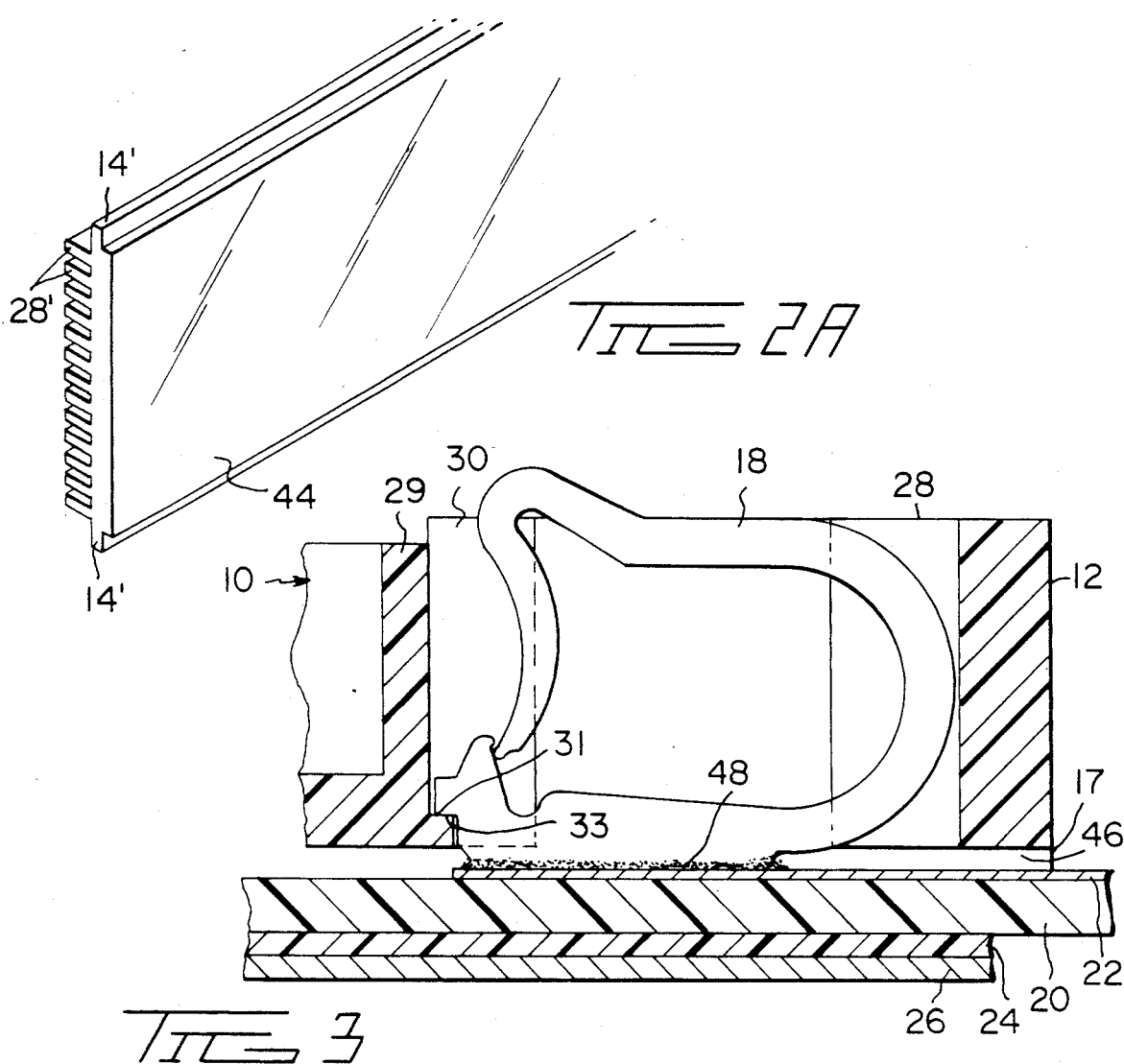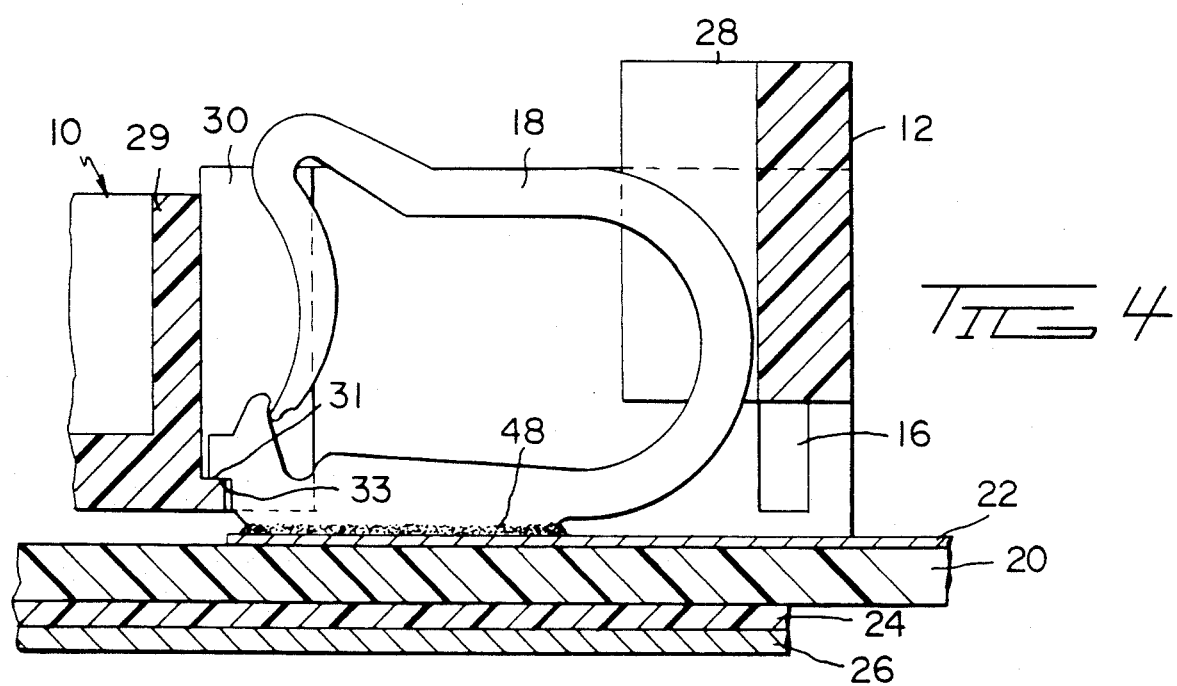

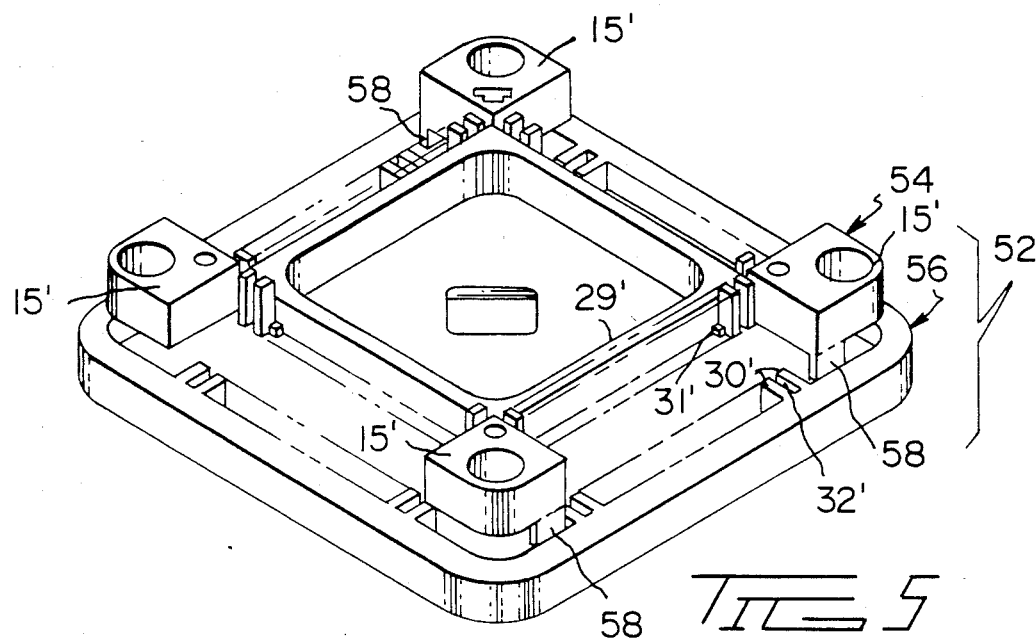
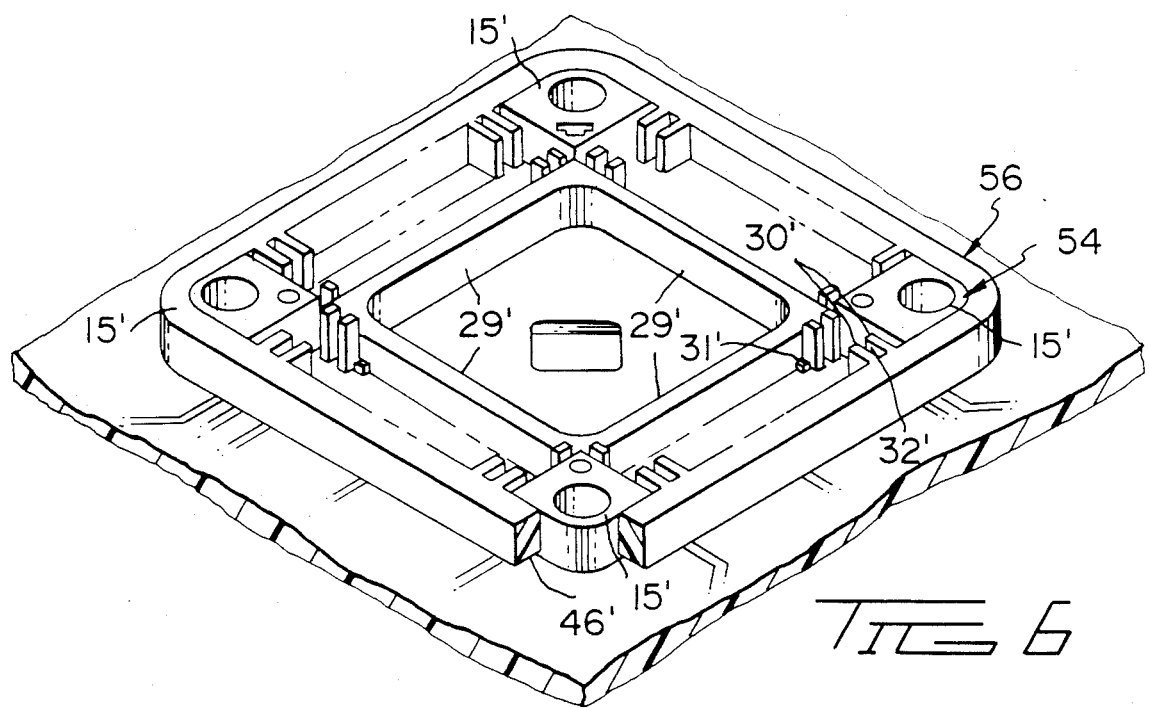

LEADLESS INTEGRATED CIRCUIT PACKAGE HOUSING HAVING MEANS FOR CONTACT REPLACEMENT

BACKGROUND OF THE INVENTION

This invention relates, generally, to a housing for leadless integrated circuit devices and more particularly to a housing for a leadless integrated circuit device having a portion which is removeable therefrom so as to allow individual replacement of contacts contained therein.

With the advent of VLSI circuitry, leadless integrated circuit devices in the form of chip carriers and chip carrier housings are being utilized more and more frequently. These types of applications require high density contact spacing while maintaining optimum contact mating forces which minimize resistive, capacitive and inductive effects. Examples of high density contact structures may be found in U.S. Pat. No. 4,268,102 "Low Impedance Electrical Connecting Means For Spaced-Apart Conductors" issued May 19, 1981 to Grabbe; U.S. Pat. No. 4,052,118 "Contact Carrying Spring Member" issued Oct. 4, 1977 to Scheingold et al; and U.S. Pat. No. 3,940,786 "Device For Connecting Leadless Integrated Circuit Package To A Printed Circuit Board" issued Feb. 24, 1976 to Scheingold et al.

Consequently these types of devices are relatively complicated by their nature in that chip carrier packages are expensive and generally are in a situation where reliability is an important factor, thereby requiring that the contacts and housings associated therewith be reliable. Heretofore however when a problem has occurred with a contact, either due to environmental or external problems such as, misapplication of a chip carrier package to the housing, removal of the entire housing was required so as to facilitate disassembly and replacement of particular contacts. This extraction and reinsertion process in and of itself may create problems which are undesirable in that subsequent soldering may result in cold soldering joints or undesirable contact deformation.

It is desirable to have a device which allows for individual contact removal and/or replacement without disturbing the remaining contacts in the structure or housing. Further, it is desirable to have a housing which facilitates such removal and/or replacement in a relatively simple manner, with the housing relatively inexpensive to manufacture and assemble and which is capable of integration with a variety of differing housing structures. Such a device is taught by the present invention.

Accordingly, the present invention teaches and as an object of the present invention, a chip carrier housing for connecting a leadless integrated circuit chip carrier to a circuit board comprising a circuit board having conductive strips contained thereon, and a chip carrier housing disposably disposed on this circuit board with the housing having a continuous interior or inner wall and at least one removably removable exterior or outer wall, the interior and exterior walls each having contact spacing barriers disposed perpendicularly thereto, thereby defining a plurality of slots for receivably receiving electrically conductive contacts, and electrically conductive contacts disposed in each of the slots for providing electrical communication between a leadless integrated circuit chip carrier and electrical conductors contained on the circuit board, a leadless integrated circuit chip carrier disposed on the housing and a chip carrier retaining bracket disposed on top of the housing and the leadless integrated circuit chip carrier for securing the integrated circuit chip carrier to the housing and thence the electrical contact.

BRIEF DESCRIPTION OF THE DRAWINGS

Reference is now made to the description of the preferred embodiment illustrated in the accompanying drawings in which:

FIG. 1 is an exploded isometric view of a chip carrier housing shown with associated components such as the circuit board and contacts;

FIG. 2 is an exploded isometric view of an assembled chip carrier housing along with the components to be mounted thereon;

FIG. 2A is an isometric view of an extruded portion of the chip carrier housing;

FIG. 3 is a cross-sectional view taken through FIG. 2 showing the relationship of the contact to the main and removable portions of the housing;

FIG. 4 is a cross-sectional view similar to FIG. 3 showing a portion of the housing partially removed;

FIG. 5 is an isometric view of an alternate embodiment of a chip carrier housing; and FIG. 6 is an isometric view of the chip carrier housing of FIG. 5 mounted on a printed circuit board with the housing having a portion thereof cut away for illustration purposes.

DESCRIPTION OF THE PREFERRED EMBODIMENT

It is to be remembered that components similar in structural operation to previously described components will be identified by the previously assigned numeral with the addition of a prime (').

Referring now to FIG. 1 there is shown an isometric exploded view of the chip carrier housing of the present invention. A chip carrier housing shown generally at 10 has four removable exterior walls 12 (only two shown). The removable exterior walls 12 have end tabs 14 which slide into end tab receiving slots 16 contained on the corner posts 15 of the chip carrier housing 10. This therefore allows the removable exterior or outer walls 12 to be inserted into or removed from the chip carrier housing 10. Contacts 18 which may be of the type found in U.S. Pat. No. 4,354,729 "Preloaded Electrical Contact Terminal" issued Oct. 19, 1982 to Grabbe et al, and which is included by reference herein, are utilized. The housing 10 is mounted onto a printed circuit board 20 with the printed circuit board 20 having conductive strips 22 thereon thereby allowing electrical communication between the contacts 18 and the conductive strips 22 and thence to associated circuitry (not shown). Disposed under the printed circuit board 20 is a spacer 24 and a lower mounting plate 26 which are used to securely maintain the housing and associated components on the printed circuit board 20 (shown more clearly in FIG. 2). The removable exterior wall 12 has exterior or outer wall contact spacing barriers 28 disposed thereon which align with housing contact spacing barriers 30 and which are disposed on the housing interior or inner walls 29. The housing contact spacing barriers 30 and the exterior wall contact spacing barriers 28 are used to provide physical and electrical isolation of the contacts 18 (shown more clearly in FIGS. 2, 3, and 4). A contact retaining ledge 31 is disposed between the housing contact spacing barriers 30 on the housing interior wall 29 and are utilized in conjunction with the contact recesses 33 disposed on the contact 18. The spacing barriers 28, 30 form contact receiving slots 32 and which in conjunction with the contact retaining ledge 31 are used to maintain the contact 18 in the housing 10 (shown more clearly in FIGS. 2, 3, and 4). The end tab receiving slots 16 as shown in the housing 10 do not extend completely through the chip carrier housing 10, but rather leave a spacing ledge 17. The removable exterior wall 12 is not as thick as the chip carrier housing 10 and therefore when the removal exterior wall 12 is inserted into the chip carrier housing 10, the top portion of the wall 12 will be flush with the top portion of the chip carrier housing 10 and will leave a space between the lower portion of the removable exterior wall 12 and the printed circuit board 20 (shown more clearly in FIGS. 2, 3, and 4). Mounting holes 34 are disposed in the chip carrier housing 10, the printed circuit board 20, the spacer 24 and the lower mounting plate 26 and allow for proper alignment of the entire assembly as shown more clearly in FIG. 2.

Referring now to FIG. 2 there is shown an exploded isometric view of the housing 10 of the present invention in conjunction with associated components. Here it can be seen how a contact retaining bracket 36 is to be disposed on the chip carrier housing 10 thereby maintaining the contacts 18, removable exterior wall 12, and the chip carrier housing 10 as a package. The chip carrier 38, which in the preferred embodiment of the present invention is a leadless integrated circuit package, is then placed on top of the contact retaining bracket 36 so that conductive pads (not shown) contained on the underside of the chip carrier 38 will make electrical contact with the contact 18. Disposed on top of the chip carrier 38 is a chip carrier retaining bracket 40 which rigidly maintains the chip carrier 38 in proper physical and electrical contact. Mounting bolts 42 are then inserted through the mounting holes 34 thereby affixing the entire assembly to the printed circuit board 20.

Referring now to FIG. 2A there is shown an isometric view of an extruded removable exterior or outer contact spacing wall 44. The wall 44 in the preferred embodiment of the present invention is comprised of plastic and is molded in a continuous form and is then cut into the proper dimensions for the chip carrier housing 10. Here it can be seen that the end tabs 14' are in a continuous strip along with the exterior wall contact spacing barriers 28'.

Referring now to FIG. 3 there is shown a cross sectional view taken through a portion of the assembled housing of FIG. 2. Here it can be seen how the contact 18 resides in the chip carrier housing 10. The contact recess 33 rests on the contact retaining ledge 31 thereby helping to retain the contact 18 in the housing 10. Shown is the relationship of the contact 18 to the housing interior wall 29 which has the housing contact spacing barriers 30 attached thereto and the removable exterior wall 12 and the exterior wall contact spacing barriers 28 attached thereto. Shown also is how the lower portion of the contact 18 makes electrical contact with the conductive strip 22. The spacing ledge 17 creates a gap, shown generally at 46, between the bottom portion of the removable exterior wall 12 and the conductive strips 22 contained on the printed circuit board 20. This gap 46 allows for the free flow of solder 48 as well as providing a means for physical examination of the contact 18 and the solder 48.

Referring now to FIG. 4 there is shown a view similar to that of FIG. 3. Here it can be seen how the removable exterior wall 12 may be removed from the printed circuit board 20 and the chip carrier housing 10. This removal would generally take place when one of the contacts 18 is damaged and/or becomes faulty or is suspected of such. In order to accomplish this contact removal, the contact retaining bracket 36, the chip carrier 38 and the chip carrier retaining bracket 40 (as shown in FIG. 2) would be removed. The removable exterior wall 12 would then be lifted upward and removed from the chip carrier housing 10. Removal of the exterior contact spacing wall 12 will not disturb the contacts 18. At this point the contact 18 may be inserted and/or electrically checked for continuity and resistivity and/or replaced by generally known desoldering and soldering techniques which as mentioned are generally known to one skilled in the art. Upon replacement or inspection the exterior wall 12 would be replaced with the contact retaining bracket 36, chip carrier 38, and the chip carrier retaining bracket 40 similarly replaced.

Referring now to FIG. 5, there is shown an alternate embodiment of the present invention. It is to be remembered that the chip carrier housing alternate embodiment shown generally at 52 would interface with the printed circuit board 20, the chip carrier 38, and the retaining brackets 36 in a manner identical to that of the previous figures. Here, the chip carrier housing alternate embodiment 52 is comprised of, a chip carrier main housing 54 which is comprised of a housing interior or inner walls 29' and corner posts 15', and a main housing outside section 56. The chip carrier main housing 54 and the main housing outside or outer section 56 are joined by main housing standoffs 58. This thereby enables the entire alternate embodiment 52 to be constructed as a single unitary piece in a single operation for manufacturing purposes and is comprised of plastic. For assembly purposes the main housing 54 is pushed down into the outside section 56 such that the standoffs 58 are broken away and discarded. This thereby leaves a chip carrier housing alternate embodiment 52 as shown in FIG. 6. Upon replacement and/or inspection of contacts 18 the entire outside section 56, in that it is a form of a collar, is lifted up and removed from the main housing 54. Similarly as in FIGS. 3 and 4, a gap 46' is utilized since the height of the outside section 56 is slightly less than the main housing 54.

It is to be remembered that many variations of the present invention may be utilized without departing from the spirit and scope of the present invention. Additionally, circuit boards may include any board, card, or substrate in which electrical conductors are secured. Also, soldering may or may not be utilized as desired and if used need not necessarily be of a reflow solder type of operation. Further, the housings may be made of materials other than plastic. Also the gap between the lower portion of the removable section and the printed circuit board may be eliminated or enlarged while different means for holding the contact other than the ledge in the housing may be utilized. Further, different types of slot arrangements between the removable and main parts of the housing may be used and different manufacturing methods other than extrusion such as piece meal may be accomplished. Additionally, the contacts may be different in that beam and bend configurations or other types than that shown.

Therefore, in addition to the above enumerated advantages the disclosed invention produces a housing which is relatively easy to manufacture, usable with a large variety of contact configurations and which is inexpensive to manufacture. Further, maintenance and inspection of contacts on a continuous basis is relatively easy to accomplish and does not require removal of an entire chip carrier housing along with the contacts associated therewith from the printed circuit board.

We claim:

1. A chip carrier housing for connecting a leadless integrated circuit chip carrier to a circuit board, comprising:
   a circuit board having conductive strips contained thereon;
   chip carrier housing means disposed on said circuit board, said housing means having a continuous interior or inner wall and at least one removable exterior or outer wall, said interior and said exterior walls each having contact spacing barriers disposed perpendicular thereto, thereby defining a plurality of slots for receivably receiving electrically conductive contacts;
   an electrically conductive contact disposed in each of said slots for providing electrical communication between a leadless integrated circuit chip carrier and said electrical conductors contained on said circuit board;
   a leadless integrated circuit chip carrier disposed on said housing means; and
   a chip carrier retaining bracket disposed on top of said housing and said leadless integrated circuit chip carrier for securing said integrated circuit chip carrier to said housing and thence said electrical contacts.

2. A device according to claim 1 wherein said circuit board is a printed circuit board.

3. A device according to claim 1 wherein said housing is comprised of plastic.

4. A device according to claim 1 wherein a removable exterior wall is disposed on each side of said housing.

5. A device according to claim 1 wherein said removable exterior wall has at least one tab disposed at each end thereof, said tab configured so as to mate with receiving slots contained in said interior wall.

6. A device according to claim 1 wherein said exterior wall is comprised of a continuous unitary ring type structure for conformably surrounding said interior wall.

7. A device according to claim 5 wherein said exterior wall is made from an extruded molding, cut into suitable widths.

8. A device according to claim 6 wherein said inner and said outer walls are molded as a singular piece joined by at least one breakable standoff.

9. A chip carrier housing for connecting a leadless integrated circuit chip carrier to a circuit board, comprising:
   a circuit board having conductive strips contained thereon;
   chip carrier housing means disposed on said circuit board, said housing means having:
   four interior or inner walls in a generally square configuration;
   contact spacing barriers disposed perpendicular to said interior walls thereby defining a plurality of slots for receiving contacts;
   corner posts formed at each joint of said interior walls;
   tab receiving slots disposed in each side of said corner slots which are adjacent to said interior wall;
   four exterior or outer walls, each of which is disposed between said corner posts, having contact spacing barriers disposed perpendicular thereto thereby defining a plurality of slots for receiving electrical conductive contacts, said exterior walls further having an end tab disposed at each end thereof, said tabs engaging said tab receiving slots, said exterior walls thereby being removable from said corner post;
   an electrically conductive contact disposed between said contact spacing barriers for providing electrical communication between a leadless integrated circuit chip carrier and said electrical conductors contained on said circuit board;
   a leadless integrated circuit chip carrier disposed on said housing means; and
   a chip carrier retaining bracket disposed on top of said housing and said leadless integrated circuit chip carrier for securing the integrated circuit chip carrier to said housing and thence said electrical contacts.

10. A chip carrier housing for connecting a leadless integrated circuit chip carrier to a circuit board, comprising:
    a circuit board having conductive strips contained thereon;
    chip carrier housing means disposed on said circuit board, said housing means having four interior or inner walls in a generally square configuration;
    contact spacing barriers disposed on said interior walls and perpendicular thereto, said spacing barriers defining a plurality of slots for receiving electrically conductive contacts therein;
    corner posts formed at each joint of said interior walls;
    a continuous exterior or outer removable wall, said exterior wall adapted so as to surround said inner walls and said corner posts, and having contact spacing barriers disposed thereon and perpendicular thereto, said contact spacing barriers defining a plurality of slots receiving electrically conductive contacts;
    an electrically conductive contact disposed in each of said slots for providing electrical communication between a leadless integrated circuit chip carrier and said electrical conductors contained on said circuit board;
    a leadless integrated circuit chip carrier disposed on said housing means; and
    a chip carrier retaining bracket disposed on top of said housing and said leadless integrated circuit chip carrier for securing the integrated circuit chip carrier to said housing and thence said electrical contacts.

* * * * *